United States Patent [19]

Iwamoto et al.

[11] Patent Number: 4,544,912
[45] Date of Patent: Oct. 1, 1985

[54] SCALE SWITCHABLE DIGITAL-TO-ANALOG CONVERTER

[75] Inventors: Hiromu Iwamoto; Haruo Tamada, both of Yokohama, Japan

[73] Assignee: Fujitsu Limited, Kawasaki, Japan

[21] Appl. No.: 574,209

[22] Filed: Jan. 27, 1984

Related U.S. Application Data

[63] Continuation-in-part of Ser. No. 183,735, Sep. 30, 1980, abandoned.

[30] Foreign Application Priority Data

Sep. 4, 1979 [JP] Japan .................. 54-113289

[51] Int. Cl.⁴ .............................. H03K 13/02
[52] U.S. Cl. .................. 340/347 AD; 340/347 CC; 340/347 DA; 340/347 M
[58] Field of Search .... 340/347 M, 347 DA, 347 CC, 340/347 AD

[56] References Cited

U.S. PATENT DOCUMENTS 3,810,158  5/1974  Murakami et al. .......... 340/347 DA
4,020,485  4/1977  Busby .................. 318/601 X

OTHER PUBLICATIONS

The Engineering Staff of Analog Devices, Inc., Analog-Digital Conversion Handbook, 6/1972, pp. III-50 and III-51, II-32 to II-39.
Stout, Basic Electrical Measurements, Prentice-Hall, Inc., 1950, pp. 50-56.
Millman et al., Pulse and Digital Circuits, McGraw-Hill Book Co., Inc., 1956, pp. 2 and 3.
Schmid, Electronic Analog/Digital Conversions, Van Nostrand Reinhold Co., 1970, pp. 175-179.
Digital Equipment Corporation, Analog-Digital Conversion Handbook, 1964, pp. 39, 40 and 59.

Primary Examiner—T. J. Sloyan
Attorney, Agent, or Firm—Staas & Halsey

[57] ABSTRACT

A D/A converter of the resistor ladder type provided with full-scale switching circuits between the output terminal of the series connected resistors and ground for selecting the value of resistance of the full-scale control resistor, thereby selecting the value of the full-scale voltage.

7 Claims, 9 Drawing Figures

INPUT CAPACITANCE OF COMPARATOR OR THE LIKE

D/A CONVERTER

R: IMPEDANCE OF R-2R LADDER CIRCUIT

PRESENT INVENTION

CASE WHERE FULL-SCALE VALUE IS CHANGED BY CHANGING Vref IN CIRCUIT OF FIG. 1, OR CASE WHERE FULL-SCALE VALUE IS NOT CHANGED IN CIRCUIT OF FIG. 1

SCALE SWITCHABLE DIGITAL-TO-ANALOG CONVERTER

This application is a continuation-in-part, of application Ser. No. 183,735, filed Sept. 30, 1980, now abandoned.

BACKGROUND OF THE INVENTION

1. Field of the Invention

The present invention relates to a digital-to-analog converter (D/A converter). The D/A converter according to the present invention is used in, for example, an analog-to-digital conversion device of a step-by-step comparison type for processing signals in electronic circuit devices.

2. Description of the Prior Art

A prior art D/A converter comprising a resistor ladder network having a plurality of first resistors of resistance value R and a plurality of second resistors of resistance value 2R is illustrated in FIG. 1. In the D/A converter of FIG. 1, "n−1" first resistors of resistance value R are connected in series between a first terminal $P_1$ and a second terminal $P_n$, connection points $P_2$, $P_3$, ..., $P_{n-1}$ being formed between adjacent resistors of resistance value R. One terminal of each of the "n" second resistors of resistance value 2R is respectively connected with the first terminal $P_1$, the connection points $P_2$, $P_3$, ..., $P_{n-1}$ and the second terminal $P_n$. Another resistor of resistance value 2R is connected between the second terminal $P_n$ and a ground GR. The other terminals $Q_1$, $Q_2$, ..., $Q_n$ of said "n" second resistors of resistance value 2R are respectively connected to fixed contacts of switching elements $a_1$, $a_2$, ..., $a_n$. Switchable contacts of each of the switching elements $a_1$, $a_2$, ..., $a_n$ consist of a function "1" contact which is connected to a reference voltage source $V_{ref}$ and a function "0" contact which is connected with the ground GR. Semiconductor switching elements may be used for the switching elements $a_1$, $a_2$, ..., $a_n$. The switching elements $a_1$, $a_2$, ..., $a_n$ are switched in accordance with digital input signals. A function "1" contact is closed when the applied digital signal is signal "1", while a function "0" contact is closed when the applied digital signal is signal "0". An output analog signal V is produced at a terminal X as a result of a digital to analog conversion effected by the resistor ladder network containing the switching elements. The value of V is expressed as follows.

$$V = \left[ \frac{1}{2} a_1 + \frac{1}{4} a_2 + \frac{1}{8} a_3 + \ldots + \frac{1}{2^{n-1}} \cdot a_{n-1} + \frac{1}{2^n} \cdot a_n \right] \cdot V_{ref} \quad (1)$$

In this equation (1), the value of each of $a_1, a_2, \ldots, a_n$ is "1" when the switching element in question is connected to the reference voltage $V_{ref}$, and "0" when the switching element in question is connected to ground GR.

The output impedance $Z_{out}$ at the output terminal X of the D/A converter of FIG. 1 is equal to R. The full-scale value $V_f$ of the output voltage of the D/A converter of FIG. 1 is obtained when all of the switching elements $a_1, a_2, \ldots, a_n$ are in the "1" state, i.e. the value of the input signal is the maximum value. The value $V_f$ is expressed as follows.

$$V_f = \frac{2^n - 1}{2^n} \cdot V_{ref} \quad (2)$$

In the D/A converter of FIG. 1, it is necessary to vary the full-scale value $V_f$ depending on the use of the D/A converter. In the prior art, the full-scale value $V_f$ is varied in an analog manner.

However, such a prior art device is disadvantageous because another D/A converter must be provided to produce a variable reference voltage signal $V_{ref}$ which is supplied to the D/A converter of FIG. 1 in order to effect analog control of the full-scale value $V_f$, and hence this prior art D/A converter device is very complicated.

Another prior art D/A converter of the resistor ladder network type is illustrated in FIG. 2. One terminal of each of a sequence of resistors of n resistance value R, 2R, 4R, ..., $2^{n-2}R$ and $2^{n-1}R$ are joined together at the terminal P'. The other terminal of each of the sequence of n resistors is connected with the fixed contact of each of the switching elements $a_1, a_2, \ldots, a_n$. The function "0" contact of each of the switching elements is connected to ground GR, while the function "1" contact of each of the switching elements is connected to the reference voltage source $V_{ref}$. The joined terminal P' of the resistors is connected to one input of a current-to-voltage conversion amplifier AMP. The other input of the amplifier AMP is connected to ground GR via a resistor Rg. A feedback resistor $R_0$ is connected across the amplifier AMP. The current-to-voltage conversion ratio is varied by switching from the feedback resistor $R_0$ to the feedback resistor $R_0'$. Thus, the full-scale value of the D/A converter of FIG. 2 is controlled by selecting the resistance of the feedback resistor $R_0$ or $R_0'$ connected across the amplifier AMP.

The value of the output voltage V is expressed as follows.

$$V = -\left( \frac{1}{2} a_1 + \frac{1}{4} a_2 + \frac{1}{8} a_3 + \ldots + \frac{1}{2^n} a_n \right) \cdot \frac{R_0}{R} \cdot V_{ref} \quad (3)$$

However, this prior art device is disadvantageous since it is difficult to carry out the automatic switching between the feedback resistors $R_0$ and $R_0'$ using a digital signal, because it is necessary to change the connection of the connecting conductor W which connects the output of the AMP to one of the feedback resistors $R_0$ and $R_0'$. This method of controlling the full-scale value of the D/A converter of FIG. 2 is time-consuming and inconvenient.

Examples of prior art D/A converters of the resistor ladder network type are disclosed in the following publications:

(1) FERRANTI Semiconductors, Integrated Circuits Data Book: "D-A/A-D Converter ZN 425", Page 28, FIG. 2.

(2) DATA ACQUISITION PRODUCTS Catalog: "CMOS 10-Bit, Buffered Multiplying D/A Converter", Page 309, FIG. 1.

SUMMARY OF THE INVENTION

An object of the present invention is to eliminate the above described disadvantages in prior art D/A converters of the resistor network type.

According to the present invention a D/A converter having a resistor ladder network is including, first resistors of resistance value R are connected in series between first and second terminals, Second resistors of resistance value 2R having a first terminal respectively connected to said first and second terminals and to connection points formed between the first resistors of resistance value R. Another resistor of resistance value 2R is connected between the second terminal and ground. Fixed contacts of a plurality of switching elements are respectively connected to the other terminals of the second resistors of resistance value 2R, each of the switching elements having one switchable contact connected to a reference voltage source and the other switchable contact connected to ground. An analog output signal is obtained from the first terminal by controlling the switching elements with a digital input signal. A full-scale switching circuit is included between the first terminal and ground for selecting the resistance value of the connected resistor thus selecting the value of the full-scale voltage.

DESCRIPTION OF THE PREFERRED EMBODIMENTS

Figure 3:
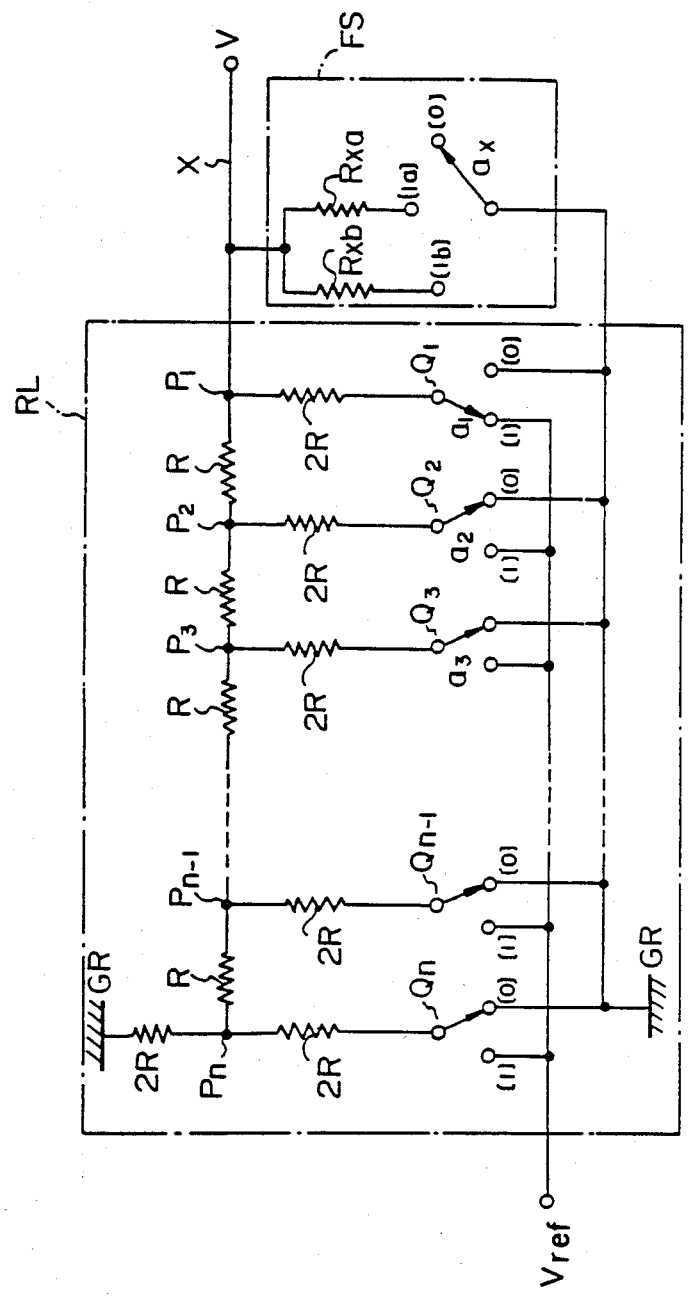
FIG. 3 illustrates a D/A converter in accordance with an embodiment of the present invention.

A D/A converter in accordance with an embodiment of the present invention is illustrated in FIG. 3. In the D/A converter of FIG. 3, the "n−1" first resistors of resistance value R are connected in series between the first terminal $P_1$ and the second terminal $P_n$, and the connection points $P_2, P_3, \ldots, P_{n-1}$ are formed between adjacent resistors of resistance value R. Terminals on one side of the "n" second resistors of resistance value 2R are respectively connected with the first terminal $P_1$, the connection points $P_2, P_3, \ldots, P_{n-1}$ and the second terminal $P_n$. Another resistor of resistance value 2R is connected between the second terminal $P_n$ and ground GR. Terminals $Q_1, Q_2, \ldots, Q_n$, on the other side of the "n" resistors of resistance value 2R are respectively connected with fixed contacts of switching elements $a_1, a_2 \ldots, a_n$. Switchable contacts of each of the switching elements $a_1, a_2, \ldots, a_n$ consist of the function "1" contact which is connected to the reference voltage $V_{ref}$ and the function "0" contact which is connected to ground GR. Semiconductor switching elements may be used for the switching elements $a_1, a_2, \ldots, a_n$. The switching elements $a_1, a_2, \ldots, a_n$ are switched by digital input signals. The function "1" contact is closed when the applied digital signal is signal "1", while the function "0" contact is closed when the applied digital signal is signal "0". The output analog signal V is produced at the terminal X as the result of a digital-to-analog conversion effected by the resistor ladder network RL with the switching elements $a_1, a_2, \ldots, a_n$.

In the A/D converter of FIG. 3, a full-scale switching circuit FS is connectd between the terminal X and ground GR. The full-scale switching circuit FS consists of full-scale control resistors $R_{xa}$ and $R_{xb}$ and a switching element $a_x$ which is controlled by a digital full-scale switching signal. When either a contact $1a$ or a contact $1b$ is closed, the value of the output voltage V is expressed as follows where the value $V_{out}$ represents the above indicated equation (1).

$$V = \frac{R_x}{R + R_x} \cdot V_{out} \quad (4)$$

When both of the contacts $1a$ and $1b$ are opened so that the state of the switching element $a_x$ is OFF, the value of the output voltage V is as follows.

$$V = V_{out} \quad (5)$$

It should be noted that the output impedance of the resistor ladder network RL is equal to the resistance value R.

If the values of the resistors $R_{xa}$ and $R_{xb}$ are selected as R and R/3, respectively, the output voltage V while the contact $1a$ is closed is $\frac{1}{2} \cdot V_{out}$ and the output voltage V while the contact $1b$ is closed is $\frac{1}{4} \cdot V_{out}$. Hence, the full-scale value of the D/A converter of FIG. 3 can be varied by switching between "0", $1a$ and $1b$. Since this switching is effected in a digital manner, the change of the full-scale value of the D/A converter of FIG. 3 is effected in a digital manner.

Although in the above embodiment only two full-scale control resistors $R_{xa}$ and $R_{xb}$ are provided, it is possible to include just one or any number of full-scale control resistors that can then be selected.

Figure 4:
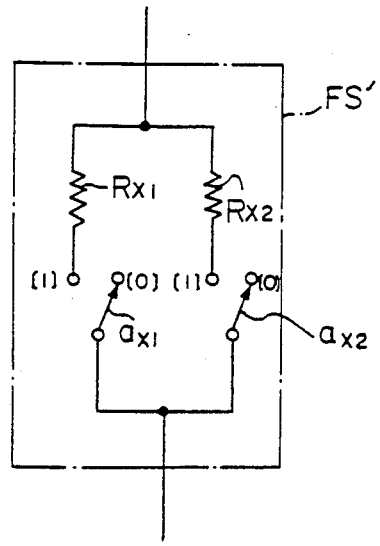
FIG. 4 illustrates a modification of the full-scale switching circuit used for the D/A converter of FIG. 3.

A modified embodiment of the full-scale switching circuit FS is illustrated in FIG. 4. This modified switching circuit FS' consists of parallel circuits of a series connected resistor $R_{x1}$ and a switching element $a_{x1}$ and a series connected resistor $R_{x2}$ and a switching element $a_{x2}$. The resistance values of the $R_{x1}$ and $R_{x2}$ may be selected as R and R/2, respectively. Each of the switching elements $a_{x1}$ and $a_{x2}$ is caused to be in an OFF state when supplied with the control signal "0". When the switching element $a_{x1}$ is supplied with the control signal "1", the resistor $R_{x1}$ is connected between the output terminal X and ground GR of circuit RL shown in FIG. 3. When the switching element $a_{x2}$ is supplied with the control signal "1", the resistor $R_{x2}$ is connected between the output terminal X and ground GR of circuit RL shown in FIG. 3.

Figure 5:
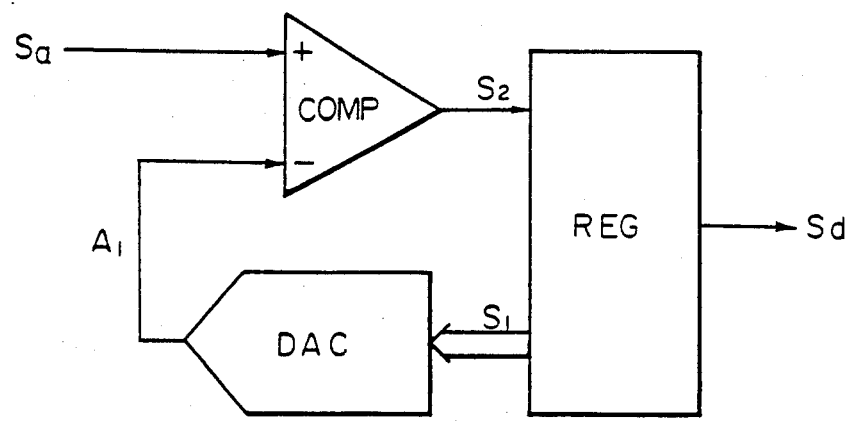
FIG. 5 illustrates an A/D conversion device to which the D/A converter of FIG. 3 can be applied.
Figure 6:
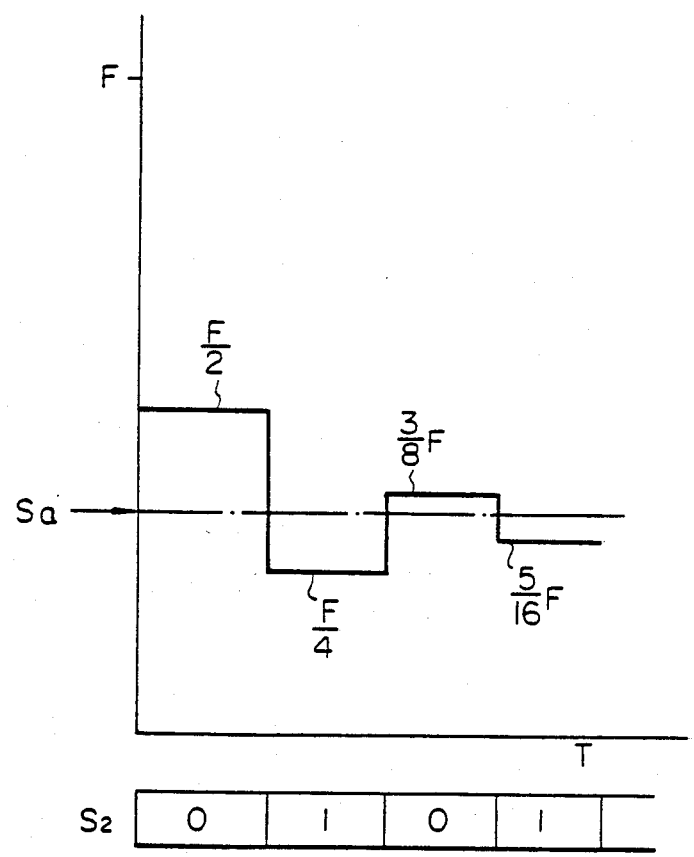
FIG. 6 graphically illustrates the operation of the A/D conversion device of FIG. 5.

The D/A converter of FIG. 3 can be used in a A/D conversion device of the step-by-step comparison type as illustrated in FIG. 5. The A/D conversion device of FIG. 5 comprises a comparator COMP, a register REG and a D/A converter DAC. An analog input signal $S_a$ and an output $A_1$ of the D/A converter DAC are compared by the comparator COMP. An output $S_2$ of the comparator COMP is registered in the register REG. The D/A converter DAC is supplied with a signal $S_1$ from the register REG. The operation of the A/D conversion device of FIG. 5 will be explained with reference to the operation diagram graphically illustrated in FIG. 6. In FIG. 6, the abscissa represents time and the ordinate represents the output of the D/A converter DAC. Prior to the first comparison by the comparator COMP, $A_1$ is assumed to be F/2, where F is a predetermined value. If the value F/2 is greater than $S_a$, the output $S_2$ of the comparator COMP becomes "0". When the register REG receives this signal "0", the register REG causes the D/A converter DAC to change the value of analog output $A_1$ to the following value.

$$A_1 = \frac{F}{2} - \left(\frac{F}{2}\right) \cdot \frac{1}{2} = \frac{F}{4} \tag{6}$$

If the value F/4, which is equal to the changed value of $A_1$ is less than $S_a$, the output $S_2$ of the comparator COMP becomes "1". When the register REG receives this signal "1", the register REG causes the D/A converter DAC to change the value of the output $A_1$ to the following value.

$$A_1 = \frac{F}{4} + \left(\frac{F}{4}\right) \cdot \frac{1}{2} = \frac{3}{8} F \tag{7}$$

Since the value $\frac{3}{8}F$ is greater than $S_a$, the output $S_2$ of the comparator COMP again becomes "0", so that the value of $A_1$ becomes as follows.

$$A_1 = \frac{3}{8} F - \left(\frac{F}{8}\right) \cdot \frac{1}{2} = \frac{5}{16} F \tag{8}$$

This procedure continues in a manner similar to that described above and as a result, the value of the output $S_1$ of the register REG approaches the value corresponding to the value of the input signal $S_a$. A binary number consisting of the sequence of the $S_2$ data "0 1 0 1" illustrated in the bottom of FIG. 6 corresponds to the value of the analog signal $S_a$. This binary number is stored in the register REG. The data stored in the register REG can be read-out as output data $S_d$ from the register REG. The D/A converter of FIG. 3 in which the full-scale value can be varied as described hereinbefore is suitable for the D/A converter DAC in the A/D conversion device of FIG. 5, because the variable full-scale characteristic of the D/A converter DAC is advantageous for responding to the change in the magnitude of the analog input signal $S_a$. The speed of operation of the entire A/D conversion device is not lowered because the response speed of the A/D converter DAC is enhanced, even when the response speed of the comparator COMP is lowered because the D/A converter DAC is operated in a low operation range. In addition, only low voltage noise is induced on a conductor connected between the output of the D/A converter DAC and the input of the comparator COMP because of the low output impedance of the D/A converter DAC when the D/A converter DAC is operated in the low operation range.

The conversion time T of an A/D conversion system, as illustrated in FIG. 5, is expressed by the following equation:

$$T = (t_{comp} + t_{reg} + t_{DA}) \times N \tag{8}$$

where $t_{comp}$ is the response time of the comparator, $t_{reg}$ is the response time of the register, $t_{DA}$ is the response time of the D/A converter, and N is the number of comparisons required for conversion. Equation 8 indicates that even if $t_{comp}$ is increased, T will not be changed if $t_{DA}$ is reduced by an equal amount. As the input voltage to the A/D converter is also reduced, $t_{comp}$ is increased. However, in the system of the present invention, $t_{DA}$ is reduced as the full-scale value is reduced if the applied input voltage is low. Therefore, according to the present invention, an A/D conversion system is obtained in which the total conversion time T is not increased and the variation in the total conversion time T is small even if the applied input voltage is low. This is because the increase in time ($t_{comp}$) associated with the comparator is offset by the decrease in time ($t_{DA}$) associated with the converter.

Figure 7:
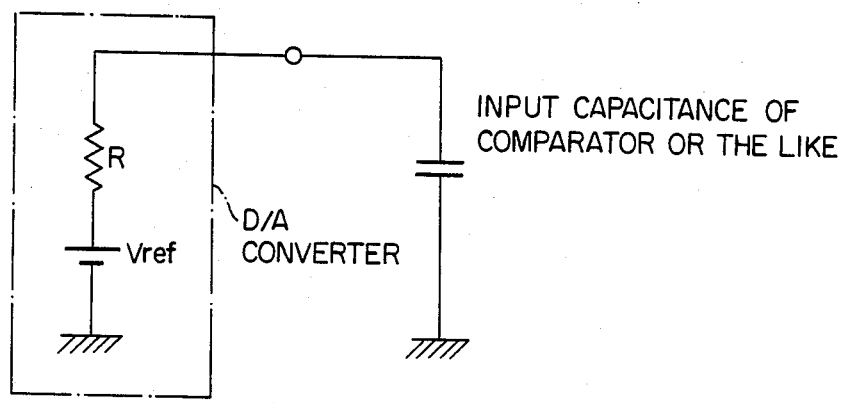
FIG. 7 is an equivalent circuit of the D/A converter of the present invention at full scale.
Figure 8:
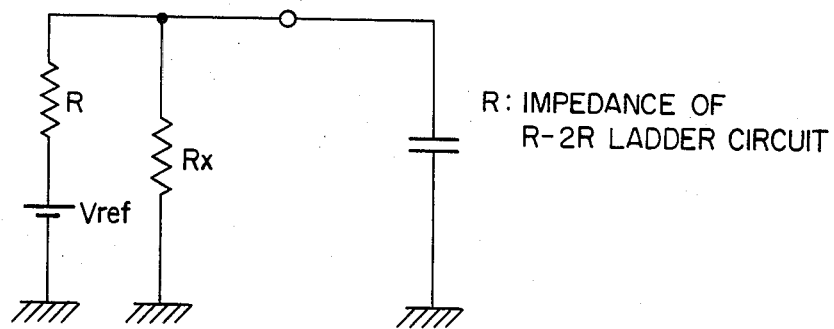
FIG. 8 is an equivalent circuit of the D/A converter of the present invention at reduced scale.

This effect is obtained because the output impedance of the D/A converter used in the A/D conversion system is reduced as the full-scale output value is reduced. It should be noted that the equivalent circuits of the D/A converter under the standard full-scale range condition and the reduced scale condition are illustrated in FIG. 7 and FIG. 8. The response time $t_{DA}$ of the D/A converter is changed according to the change of the CR time constant determined by the output impedance of the D/A converter and the load capacitance. Hence, the smaller the output impedance of the D/A converter, the more desirable. Accordingly, it is necessary to reduce the output impedance of the D/A converter when and in proportion to the amount the converted output voltage is reduced. There is also an advantage in that the D/A conversion system of the present invention is less affected by noise since the output impedance of the D/A converter is small, and hence, the voltage induced by noise is low.

Figure 1:
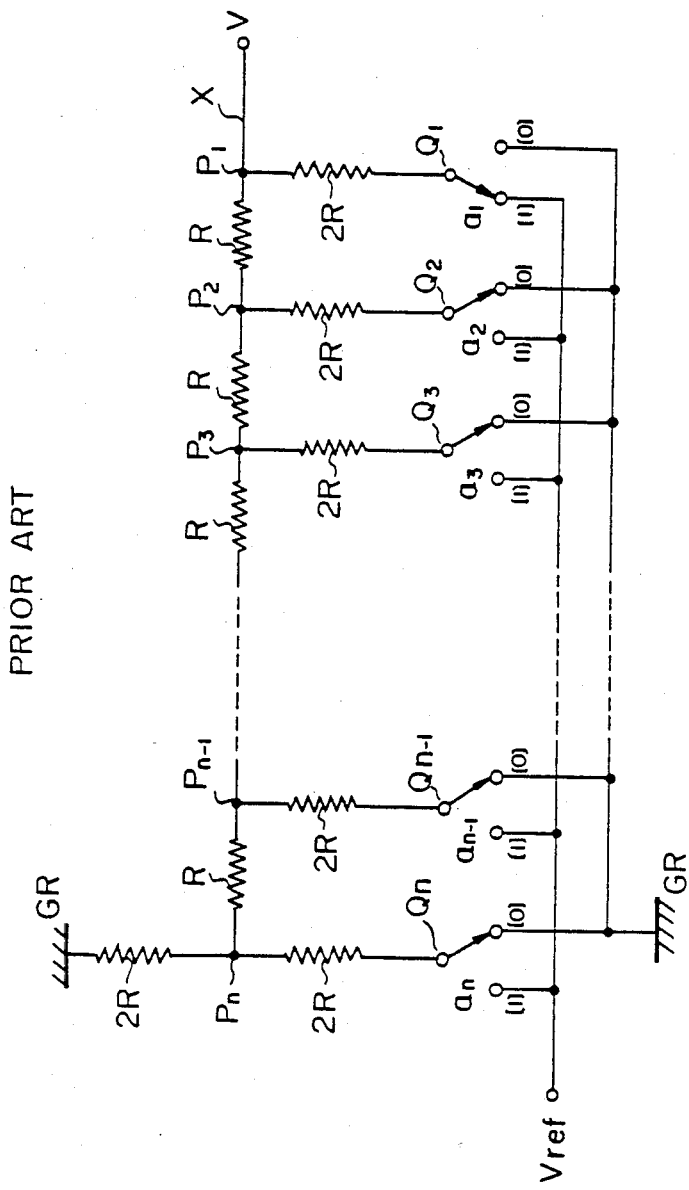
FIGS. 1 and 2 illustrate two examples of prior art D/A converters of the resistor ladder network type.
Figure 2:
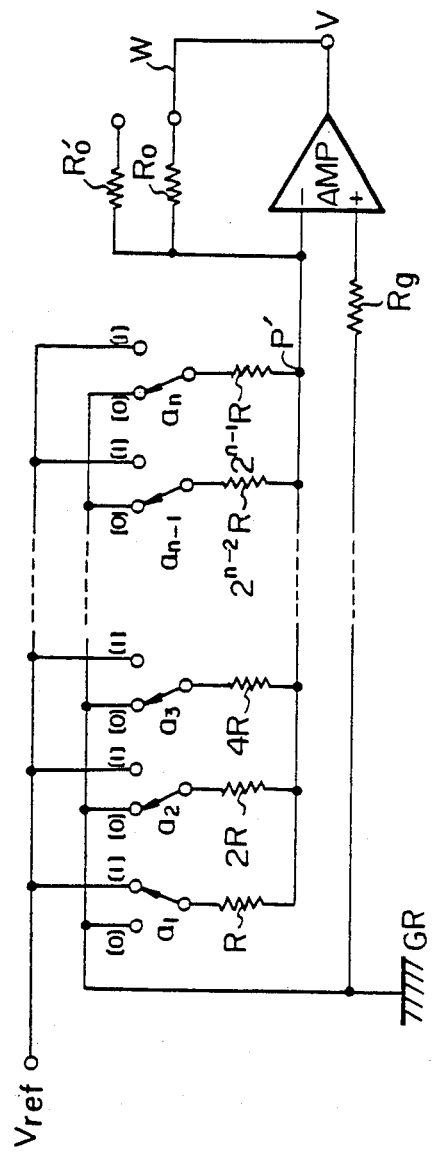
Figure 9:
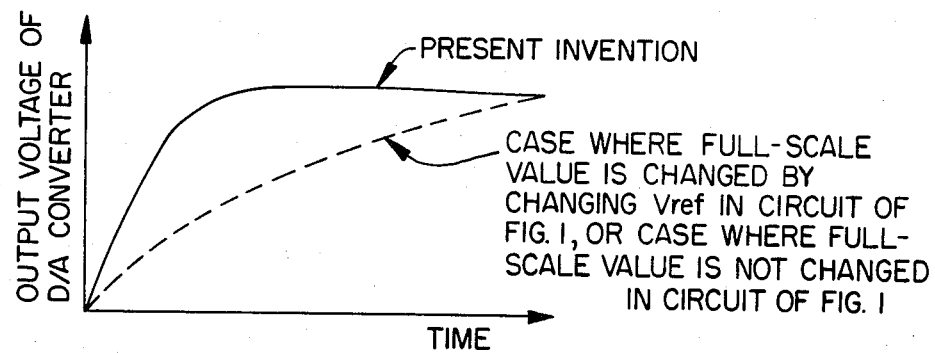
FIG. 9 is a comparison of the conversion time of the D/A converter of the present invention with the prior art conversion time.

The effect of the present invention cannot be obtained by changing the full-scale value by changing the value of the reference voltage $V_{ref}$ in the prior art circuit illustrated in FIG. 1 of the present application. Even if the $V_{ref}$ of FIG. 1 is changed, the output impedance of the R-2R ladder circuit of the D/A converter does not change. The change with time of the output voltage of the D/A converter in the A/D conversion system of the present invention is illustrated by the solid line in FIG. 9. The broken line in FIG. 9 represents the case where the full-scale value is changed by changing the value of $V_{ref}$ in the prior art circuit of FIG. 1, or the case where the full-scale value is not changed in the prior art circuit of FIG. 1.

It will be understood from the above description, that the effect of the present invention is obtained particularly because the full-scale switching circuit is used in the D/A conversion system shown in FIG. 5.

We claim:
1. An A/D converter system receiving a scale switching signal and comprising:
   a comparator for receiving an analog input voltage and producing a comparator output;
   a register, operatively connected to said comparator, for storing binary data and changing the binary data in dependence on the comparator output; and a D/A converter, operatively connected to said comparator and said register, for producing a D/A analog signal from the binary data and producing an output voltage at an output impedance, said comparator comparing the analog input voltage and the D/A analog signal and producing the comparator output, said D/A converter comprising:

a ladder switching circuit, operatively connected to said register and having a ladder circuit output operatively connected to said comparator, for producing a ladder switching circuit signal from the binary data; and a full scale switching circuit, operatively connected between the ladder circuit output and a reference voltage and to receive the scale switching signal, and including a scale control resistor, for selecting the value of the resistance of the scale control resistor responsive to the scale switching signal, so that the output voltage and the output impedance of said D/A converter is selected responsive to the scale switching signal.

2. An A/D conversion system operatively connected to receive a full-scale signal and comprising:

a comparator, having two input terminals where one is for receiving an input analog signal, for producing an output;

a register, operatively connected to said comparator, for changing binary data stored therein in response to the output of said comparator; and a D/A converter, operatively connected to said register and said comparator, for generating an output voltage corresponding to the binary data stored in said register and supplying the generated output voltage to the other input terminal of said comparator, said register having the binary data therein changed by said comparator to make the output voltage of said converter as close as possible to the input analog signal, said D/A converter comprising:

a resistor ladder network, operatively connected to receive the binary data, said resistor ladder network comprising:

a plurality of first resistors with a first resistance value operatively connected in series between first and second end terminals, having connection points between each of the connected said first resistors;

a plurality of second resistors with a second resistance value and each having first terminals, the first terminal of one of said second resistors operatively connected to the first end terminal, the first terminal of another one of said second resistors operatively connected to the second end terminal and the first terminal of the remaining ones of said second resistors operatively connected to the respective connection points between said first resistors, and each having second terminals;

a third resistor with the second resistance value operatively connected between the second end terminal and a first reference voltage; and a plurality of ladder switching circuits, each having a non-switchable contact operatively connected to the respective second terminal of one of said second resistors, each having a first switchable contact operatively connected to a second reference voltage, and each having a second switchable contact operatively connected to the first reference voltage, for switching between the first and the second reference voltages, and for obtaining an analog output signal from the first end terminal by controlling said ladder switching circuits in dependence upon the binary data; and a full-scale switching circuit, operatively connected between the first end terminal and the first reference voltage and to receive the full-scale signal, and including a full-scale control resistor, for selecting the value of the resistance of the full-scale control resistor in dependence upon the full-scale signal, so that the value of the output voltage and the output impedance of said D/A converter is selected in dependence upon the full-scale signal.

3. An A/D converter as defined in claim 2, wherein the selective switching operation of said full-scale switching circuit comprises a switch-off selection.

4. An A/D converter as defined in claim 2 or 3, wherein said full-scale control resistor has a first full-scale terminal operatively connected to the first end terminal and has a second full-scale terminal, and wherein said full-scale switching circuit further comprises:

a switching circuit, having switchable contacts, one of the switchable contacts of said switching circuit operatively connected to the second full-scale terminal of said full-scale control resistor and having a non-switchable contact operatively connected to the first reference voltage.

5. An A/D converter as defined in claim 2 or 3, wherein said full-scale switching circuit includes full-scale control resistors each having a first terminal and each having a second terminal operatively connected to the first end terminal, and wherein said full-scale switching circuit further comprises:

switching circuits each having switchable contacts, one of the switchable contacts of each of said switching circuits operatively connected with the first terminal of one of said full-scale control resistors, respectively, and each having a non-switchable contact connected to the first reference voltage.

6. An A/D converter as recited in claim 2, wherein said full-scale control resistor comprises a first resistor having a first resistance value and a second resistor having a second resistance value equal to the first resistance value divided by three.

7. An A/D converter as recited in claim 2, wherein said full-scale control register comprises a first resistor having a first resistance value and a second resistor having a second resistance value equal to the first resistance value divided by two.

* * * * *

UNITED STATES PATENT AND TRADEMARK OFFICE
CERTIFICATE OF CORRECTION

PATENT NO. : 4,544,912

DATED : Oct. 1, 1985

INVENTOR(S) : IWAMOTO et al.

It is certified that error appears in the above-identified patent and that said Letters Patent is hereby corrected as shown below:

Col. 8

Line 57, "register" s/b --resistor--.

Signed and Sealed this

Eighth Day of April 1986

[SEAL]

Attest:

DONALD J. QUIGG

Attesting Officer

Commissioner of Patents and Trademarks